(12) United States Patent
Ueda

(10) Patent No.: US 11,201,039 B2
(45) Date of Patent: Dec. 14, 2021

(54) MOUNTING APPARATUS FOR OBJECT TO BE PROCESSED AND PROCESSING APPARATUS

(71) Applicant: Tokyo Electron Limited, Tokyo (JP)

(72) Inventor: Takehiro Ueda, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 133 days.

(21) Appl. No.: 16/269,897

(22) Filed: Feb. 7, 2019

(65) Prior Publication Data

US 2019/0252159 A1 Aug. 15, 2019

(30) Foreign Application Priority Data

Feb. 15, 2018 (JP) .............................. JP2018-025241

(51) Int. Cl.
*H01J 37/32* (2006.01)
*H01L 21/683* (2006.01)
*H01L 21/687* (2006.01)
*C23C 16/458* (2006.01)
*C23C 16/50* (2006.01)
*H01L 21/67* (2006.01)

(52) U.S. Cl.
CPC .. *H01J 37/32642* (2013.01); *H01J 37/32715* (2013.01); *H01L 21/6833* (2013.01); *H01L 21/68735* (2013.01); *C23C 16/458* (2013.01); *C23C 16/50* (2013.01); *H01J 2237/334* (2013.01); *H01L 21/67069* (2013.01)

(58) Field of Classification Search
USPC .................................................... 156/345.51
See application file for complete search history.

(56) References Cited

U.S. PATENT DOCUMENTS

| | | | | |
|---|---|---|---|---|
| 6,159,055 | A * | 12/2000 | Satitpunwaycha | ......................... H01L 21/6833 439/700 |
| 2011/0043228 | A1* | 2/2011 | Makhratchev | .... H01J 37/32935 324/691 |
| 2011/0240221 | A1* | 10/2011 | Yamamoto | ........ H01J 37/32091 156/345.28 |
| 2017/0172018 | A1* | 6/2017 | Dilmaghanian | ..... F16J 15/3236 |
| 2017/0352984 | A1* | 12/2017 | Changsrivong | ...... H01R 13/187 |

FOREIGN PATENT DOCUMENTS

| | | |
|---|---|---|
| JP | 2006-049747 | 2/2006 |
| JP | 2009-239222 | 10/2009 |
| JP | 2011-054933 | 3/2011 |

* cited by examiner

*Primary Examiner* — Ram N Kackar
(74) *Attorney, Agent, or Firm* — IPUSA, PLLC

(57) ABSTRACT

A mounting apparatus for an object to be processed includes a mounting stage, on which an object to be processed is mounted inside a processing container, an edge ring disposed in a peripheral edge portion of the mounting stage, and a spring-like conductive member that includes a first spring-like member contacting the edge ring at a first recess formed in the edge ring, and a second spring-like member contacting the mounting stage at a second recess formed in the mounting stage.

7 Claims, 6 Drawing Sheets

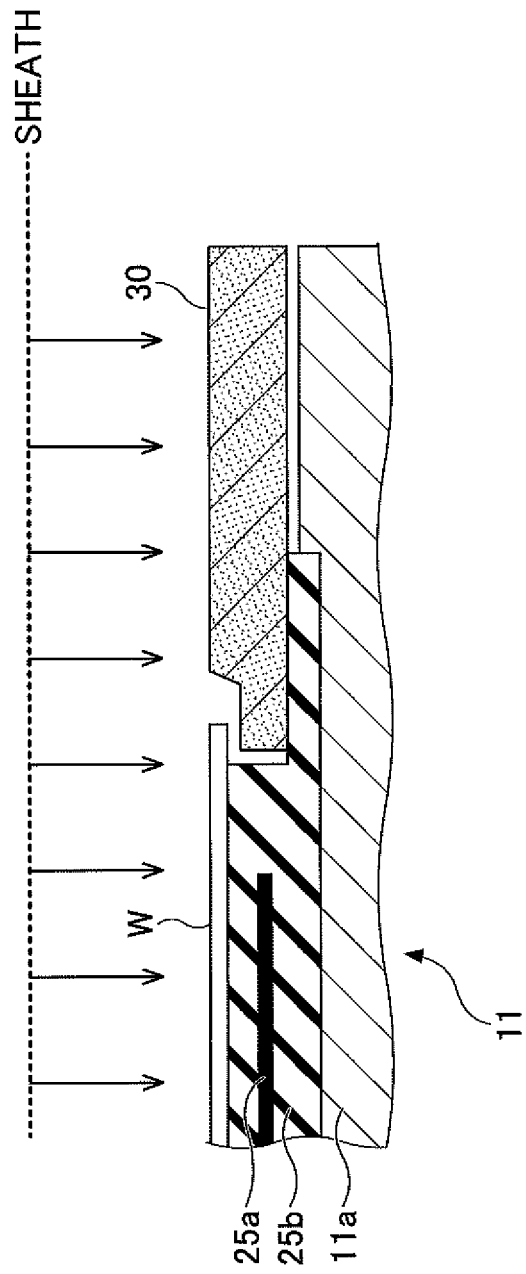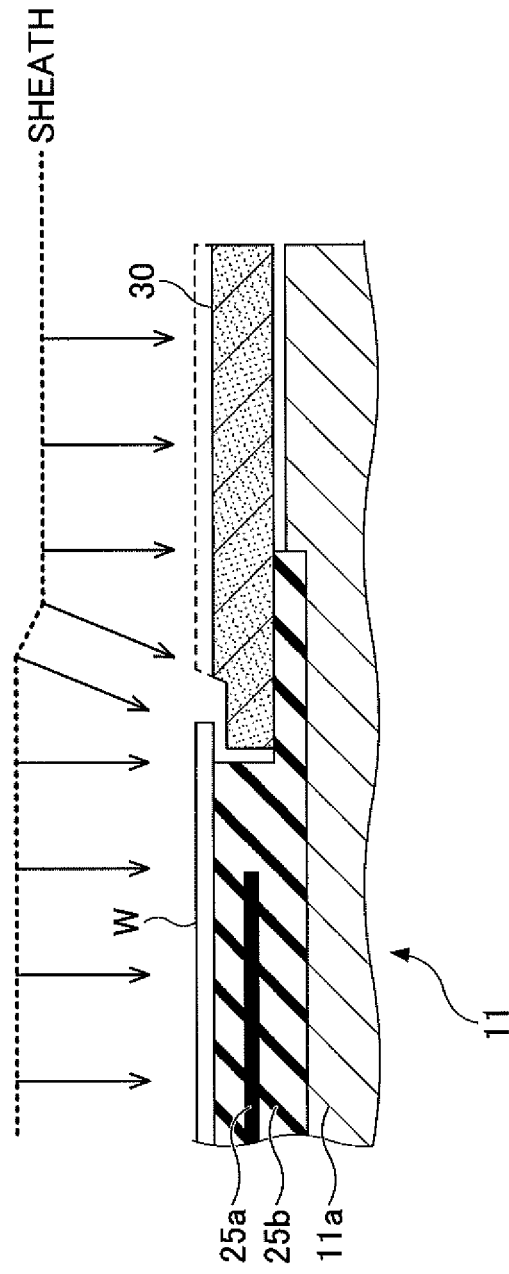

MOUNTING APPARATUS FOR OBJECT TO BE PROCESSED AND PROCESSING APPARATUS

CROSS-REFERENCE TO RELATED APPLICATIONS

This patent application is based upon and claims priority to Japanese Patent Application No. 2018-025241 filed on Feb. 15, 2018, the entire contents of which are incorporated herein by reference.

BACKGROUND OF THE INVENTION

1. Field of the Invention

The present invention generally relates to a mounting apparatus for an object to be processed and a processing apparatus.

2. Description of the Related Art

An edge ring is disposed at a peripheral edge portion of a wafer on a mounting stage inside the processing apparatus. The edge ring causes the plasma to be converged onto the surface of the wafer W when a plasma process is performed inside the treatment chamber. During the plasma process, the edge ring is exposed to plasma so as to be worn.

When the edge ring wears, a step may be formed between the edge ring and a sheath of the wafer to cause an irradiation angle of ions to slant at an edge portion of the wafer and therefore generate tilting in an etching shape. Further, the etching rate in the edge portion of the wafer varies so as to make the in-plane distribution of the etching rate uneven. Therefore, after the edge ring wears to a predetermined extent, the worn edge ring is ordinarily replaced to a new edge ring. However, a time duration for replacing the edge ring is a contributory factor for degrading the productivity.

Meanwhile, it is proposed that a direct voltage output from a direct current power source is applied to the edge ring to control the thickness of the sheath of the edge ring so that the in-plane distribution of the etching rate is controlled (see, for example, Patent Document 1).

[Patent Document 1] Japanese Laid-open Patent Publication No. 2009-239222

SUMMARY OF THE INVENTION

According to the first aspect, provided is a mounting apparatus for an object to be processed including a mounting stage, on which an object to be processed is mounted inside a processing container, an edge ring disposed in a peripheral edge portion of the mounting stage, and a spring-like conductive member that includes a first spring-like member contacting the edge ring at a first recess formed in the edge ring, and a second spring-like member contacting the mounting stage at a second recess formed in the mounting stage.

BRIEF DESCRIPTION OF DRAWINGS

FIGS. 2A and 2B explain a variation of an etching rate and tilting caused by wear of an edge ring.

DETAILED DESCRIPTION OF EMBODIMENTS

Figure 1:
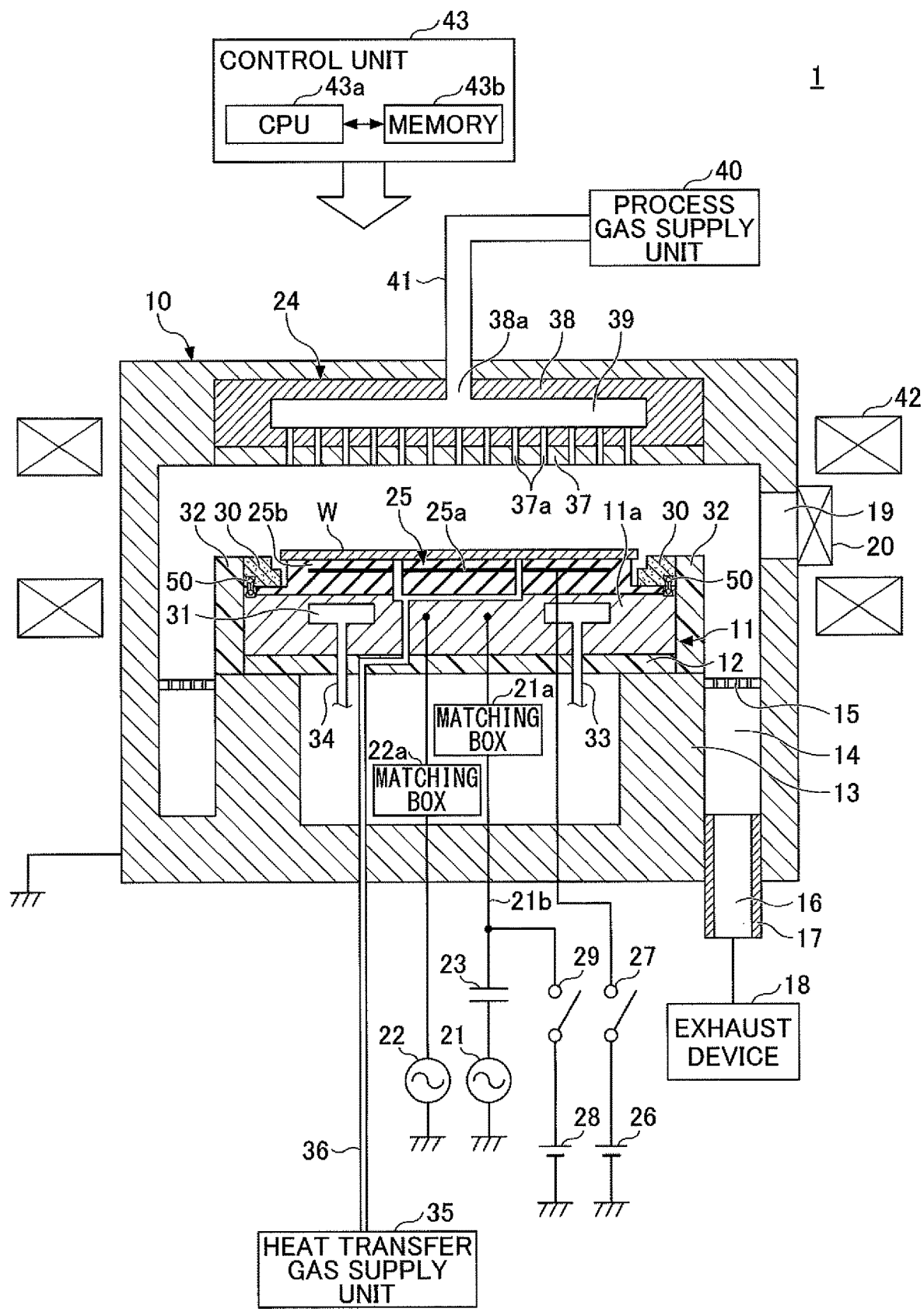
FIG. 1 illustrates an example of a process apparatus according to an embodiment of the present invention.

A direct voltage is applied to the edge ring, it is important to cause the edge ring and the base stage to stably contact. With this, the edge ring and the mounting stage have the same potential so that the thickness of the sheath of the edge ring can be accurately controlled.

To solve the above object, according to an aspect of the invention, there is provided a structure of causing to the edge ring and the mounting stage stably contact.

A description is given below, with reference to the FIG. 1 through FIG. 6 of embodiments of the present invention. Where the same reference symbols are attached to the same parts, repeated description of the parts is omitted.

REFERENCE SYMBOLS TYPICALLY DESIGNATE AS FOLLOWS

1: processing apparatus
10: processing container
11: mounting stage
11a: base stage
11a1: second recess
15: baffle plate
18: exhaust device
21: first high frequency power source
22: second high frequency power source
23: blocking capacitor
24: gas shower head
25: electrostatic chuck
25a: adsorption electrode;
25b: dielectric layer;
26: direct current power source;
28: variable direct current power source;
30: edge ring;
30a: first recess;
31: refrigerant chamber;
35: heat transfer gas supply unit;
40: process gas supply unit;
43: control unit;
50: spring-like conductive member;
50a: first spring-like member;
50a1: connection hole;
50b: second spring-like member;
50b1: connection hole; and
50c: connecting portion.

[Processing Apparatus]

At first, referring to FIG. 1, an example of the structure of a processing apparatus of an embodiment of the present invention is described. FIG. 1 illustrates an example of a cross-sectional view of the processing apparatus according to the embodiment. The processing apparatus 1 includes a processing container 10 that is in a shape of cylinder and is made with a metal such as aluminum and stainless steel. The inside of the processing container 10 functions as a treatment chamber performing a plasma process such as plasma etching and plasma CVD. The processing container 10 forms by separating a processing space for processing a semiconductor wafer (hereinafter, referred to as a "wafer W") as an object to be processed. The processing container 10 is grounded.

A mounting stage 11 in a disk-like shape, on which the wafer W is mounted, is disposed inside the processing container 10. The mounting stage 11 is supported by a cylindrical supporter 13 that upward and vertically extends from the bottom of the processing container 10 interposing a retaining member 12 made with alumina ($Al_2O_3$).

The mounting stage 11 includes a base stage 11a and an electrostatic chuck 25. The base stage 11a is made with aluminum. The electrostatic chuck 25 has a structure, in which an adsorption electrode 25a made of a conductive film is embedded in a dielectric layer 25b formed on the base stage 11a. A direct current power source 26 is connected to the adsorption electrode 25a through a switch 27. The electrostatic chuck 25 generates electrostatic force such as Coulomb force by direct voltage applied from the direct current power source 26 to the adsorption electrode 25a. The wafer W is adsorbed and held by this electrostatic force. The processing apparatus 1 may not have the electrostatic chuck.

The edge ring 30 is mounted in the peripheral edge portion of the wafer W. The edge ring 30 is made with Si or SiC. The mounting stage 11 and the outer periphery of the edge ring 30 are covered by the insulator ring 32.

A first high-frequency power source 21 is connected to the mounting stage 11 through a matching box 21a. The first high frequency power source 21 applies high frequency power having a first frequency (for example, frequency of 13 MHz) for generating plasma to the mounting stage 11. A second high frequency power source 22 is connected to the mounting stage 11 through a matching box 22a. The second high-frequency power source 22 applies high frequency power having a second frequency (for example, a frequency of 3.2 MHz) that is lower than the first frequency for applying bias to the mounting stage 11. With this, the mounting stage 11 functions also as a lower electrode.

The variable direct current power source 28 is connected to a feed line 21b through a switch 29. Between a connecting point of connecting the variable direct current power source 28 to the feed line 21b and the first high frequency power source 21, a blocking capacitor 23 is provided. The blocking capacitor 23 cuts off a direct voltage from the variable direct current power source 28 so as to prevent the direct voltage from flowing into the first high frequency power source 21. The direct voltage is applied to the edge ring 30 by the direct voltage applied from the variable direct current power source 28.

A ring-like refrigerant chamber 31 extending on, for example, a circumferential direction is provided inside the base stage 11a. A refrigerant, for example, cooling water having a predetermined temperature is supplied and circulates from a chiller unit through pipes 33 and 34 to the electrostatic chuck 25 so as to cool the wafer W.

The heat transfer gas supply unit 35 is connected to the electrostatic chuck 25 through the gas supply line 36. The heat transfer gas supply unit 35 supplies the heat transfer gas through the gas gas supply line 36 to a space between the upper surface of the electrostatic chuck 25 and the back surface of the wafer W. The heat transfer gas is preferably a gas having heat conductivity such as a He gas.

An exhaust passage 14 is formed between the sidewall of the processing container 10 and a cylindrical supporter 13. A ring-like baffle plate 15 is disposed at an inlet of the exhaust passage 14, and an exhaust port 16 is provided in a bottom portion. An exhaust device 18 is connected to the exhaust port 16 through the exhaust pipe 17. The exhaust device 18 includes a vacuum pump and depressurizes a processing space inside the processing container 10 to be a predetermined degree of vacuum. The exhaust pipe 17 has an automatic pressure control valve (APC) that is a variable butterfly valve, which automatically performs a pressure control inside the processing container 10. A gate valve 20 for opening or closing a carry-in and carry-out port 19 for the wafer W is attached to the sidewall of the processing container 10.

A gas shower head 24 is provided in a ceiling portion of the processing container 10. The gas shower head 24 includes an electrode plate 37 and an electrode supporter 38 that attachably and detachably supports the electrode plate 37. The electrode plate 37 has a large number of gas vents 37a. A buffer chamber 39 is provided inside the electrode supporter 38. A process gas supplying unit 40 is connected to the gas introduction port 38a of the buffer chamber 39 through a gas supplying pipe 41. A magnet 42 shaped like a ring or coaxially extending is arranged in a periphery of the processing container 10.

Each composing element of the processing apparatus is connected to the control unit 43 so as to be controlled by the control unit 43. The composing elements are, for example, the exhaust device 18, the matching boxes 21a and 22a, the first high frequency power source 21, the second high frequency power source 22, the switches 27 and 29, the direct current power source 26, the variable direct current power source 28, the heat transfer gas supply unit 35, the process gas supply unit 40, and so on.

The control unit 43 includes a CPU 43a and a memory 43b, and reads and executes a control program of the processing apparatus 1 stored in the memory 43b and a processing recipe to cause the processing apparatus 1 to execute a predetermined process such as etching.

In the processing apparatus 1, for example, when the etching process is performed, the gate valve 20 is firstly opened, the wafer W is carried inside the processing container 10 and is mounted on the electrostatic chuck 25. The direct voltage from the direct current power source 26 is applied to the adsorption electrode 25a so as to cause the wafer W to be adsorbed by the electrostatic chuck 25. Further, the direct voltage from the variable direct current power source 28 is applied to the base stage 11a. Thus, the predetermined direct voltage is applied to the edge ring 30.

Further, a heat transfer gas is supplied between the electrostatic chuck 25 and the wafer W. Then, the process gas from the process gas supply unit 40 is introduced inside the processing container 10, and the inside of the processing container 10 is depressurized by the exhaust device 18 or the like. Furthermore, the first high frequency power and the second high frequency power are respectively supplied from the first high-frequency power source 21 and the second high-frequency power source 22 to the mounting stage 11.

A horizontal magnetic field directing in one direction is formed by a magnet 42 inside the processing container 10 of the processing apparatus 1. An RF electric field is formed in the vertical direction by high-frequency power applied to the mounting stage 11. With this, the process gas ejected from the gas shower head 24 is converted to plasma. A predetermined plasma process is provided to the wafer by radicals and ions in the plasma.

[Wear of the Edge Ring]

Referring to FIGS. 2A and 2B, a change of the sheath generated by wear of the edge ring 30 and variations in the etching rate and tilting are described. Referring to FIG. 2A, when the edge ring 30 is new, the thickness of the focus ring 30 is designed so that the upper surface of the wafer W and the upper surface of the edge ring 30 have the same height. At this time, the sheath on the wafer W being subjected to the plasma processing and the sheath on the wafer W have the same height. In this state, the irradiation angle of ions from plasma onto the wafer W and the edge ring 30 is vertical. As a result, an etching shape of a hole or the like formed on the wafer W is vertical, and the in-plane distribution of the etching rate becomes uniform.

However, the edge ring 30 is exposed to the plasma and wears during the plasma processing. Then, as illustrated in FIG. 2B, the upper surface of the edge ring 30 is made lower than the upper surface of the wafer W, and the height of the sheath over the edge ring 30 is made lower than the height of the sheath over the wafer W.

At an edge portion of the wafer W, in which a step is formed between the heights of the sheaths, the irradiation angle slants so as to cause the tilting in the etching shape. Further, the etching rate in the edge portion of the wafer W varies so as to make the in-plane distribution of the etching rate uneven.

Meanwhile, within this embodiment, the direct voltage output from the variable direct current power source the base stage 11a to the edge ring 30. With this, it is possible to control the thickness of the sheath so that the height of the sheath of the wafer W and the height of the sheath of the edge ring 30 are the same. With this, it is possible to control the in-plane distribution of the etching rate and restrict the tilting.

When the direct voltage from the variable direct current power source 28 is applied to the edge ring 30, it is important that the potentials of the edge ring 30 and the base stage 11a are stably kept to be the same. Then, in the processing apparatus 1 of the embodiment, the edge ring 30 is fixed to the mounting stage by a spring-like conductive member 50. Hereinafter, referring to FIG. 3, an example of a contact structure using the spring-like conductive member 50 is described.

[Contact Structure]

Figure 3:
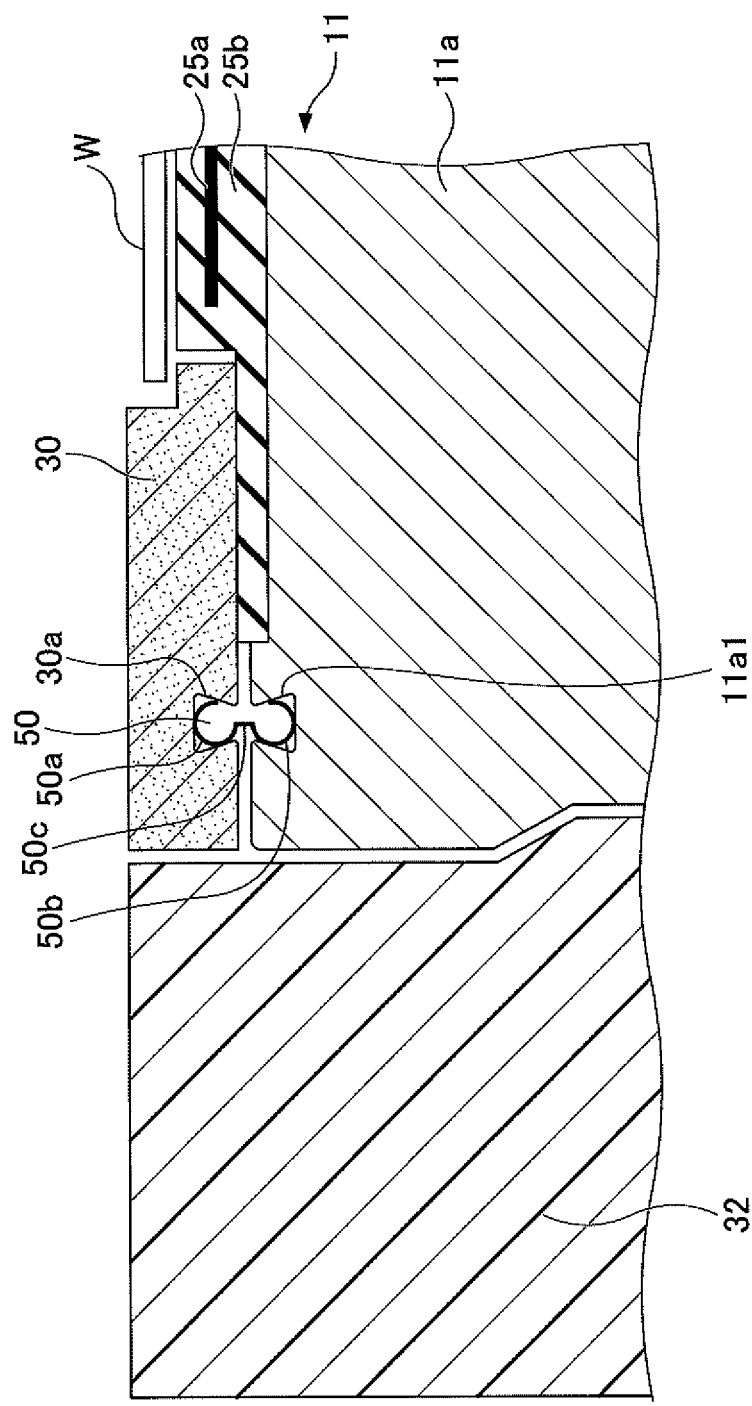
FIG. 3 illustrates an example of a contact structure, in which the edge ring contacts a mounting stage.

FIG. 3 illustrates cross-sectional views of the edge ring 30, the mounting stage 11, and the spring-like conductive member 50 along the radial direction. A first recess 30a is formed on the lower surface of the edge ring 30. The first recess 30a is a groove formed on the lower surface of the edge ring 30 along the entire periphery in the circumferential direction. A second recess 11a1 is formed on the upper face of the base stage 11a at a position facing the first recess 30a. The first second recess 11a1 is a groove formed on the upper surface of the base stage 11a along the entire periphery in the circumferential direction.

The spring-like conductive member 50 includes a first spring-like member 50a, a second spring-like member 50b, and a connecting portion 50c. Each of the first spring-like member 50a and the second spring-like member 50b is in a circular shape partly having an opening portion. A base portion of each of the first spring-like member 50a and the second spring-like member 50b is connected to the connecting portion 50c. With this, the first spring-like member 50a and the second spring-like member 50b are mutually and vertically connected.

The first spring-like member 50a is inserted into the first recess 30a formed on the edge ring 30 and contacts the edge ring 30. The second spring-like member 50b is inserted into the second recess 11a1 formed on the base stage 11a of the mounting stage 11 and contacts the base stage 11a.

The cross-sectional view of the first recess 30a in the radial direction is in a tapered shape. The opening portion of the first recess 30a is narrower than the bottom portion of the first recess 30a. Similarily, the cross-sectional view of the second recess 11a1 in the radial direction is in a tapered shape. An opening portion of the second recess 11a1 is narrower than the bottom portion of the first recess 30a.

The first spring-like member 50b fits in the first recess 30a in state where the first spring-like member 50b is inserted inside the first recess 30a. In a manner similar thereto, the second spring-like member 50b fits in the second recess 11a1 in state where the second spring-like member 50b is inserted inside the second recess 11a1.

In order to more stably cause the edge ring 30 and the mounting stage 11 to be in contact, it is preferable to make the opening portions of the first recess 30a and the second recess 11a1 narrower than the bottom portions of the first recess 30a. However, the side surfaces of the first recess 30a and the second recess 11a1 may vertically stand.

The first spring-like member 50a, the second spring-like member 50b, and the connecting portion 50c may be made with stainless steel, copper, gold, or another metal. Further, such a metal may have coating made with aluminum. Within this embodiment, the materials of the first spring-like member 50a, the second spring-like member 50b, and the connecting portion 50c may be stainless steel provided with coating of aluminum.

In the spring-like conductive member of this embodiment, the first spring-like member 50a and the second spring-like member 50b functions as a contact member in a spring-like contact member. With this, it is possible to cause the edge ring 30 and the mounting stage 11 to contact in a manner of DC while the edge ring 30 is fixed to the mounting stage 11. Said differently, when the direct voltage from the variable direct current power source 28 is applied from the mounting stage 11 to the edge ring 30 by the spring-like conductive member 50, the edge ring 3 and the mounting stage 11 are stably maintained to have the same potential so that the controllability of the sheath of the edge ring can be enhanced.

The spring-like conductive member 50 is disposed between the lower surface of the edge ring 30 and the upper surface of the base stage 11a. With this, the spring-like conductive member 50 is not directly exposed to plasma, and it is possible to obtain a structure of being hardly eroded by the plasma reaching into a space between the edge ring 30 and the base stage 11a on an outer peripheral side. With this, it is possible to prevent the abnormal electrical discharge from generating.

[Shape of spring-like conductive member]

Figure 4:
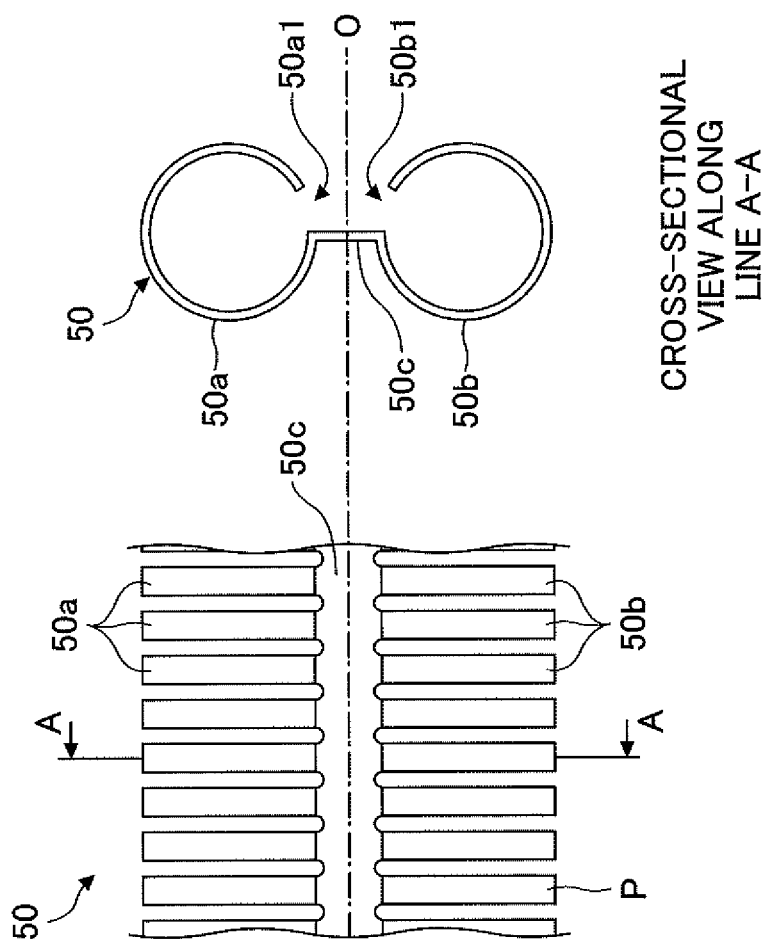
FIG. 4 illustrates an example of the shape of a spring-like conductive member according to the embodiment.
Figure 5:
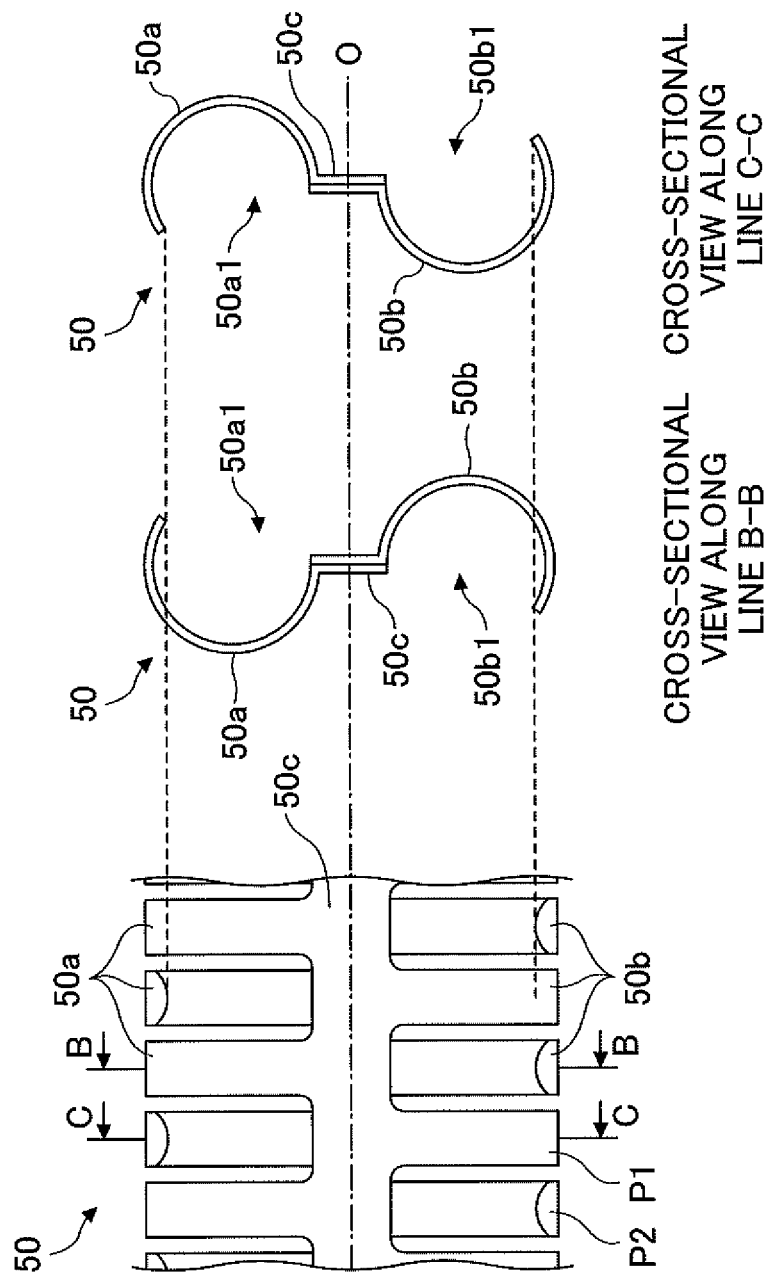
FIG. 5 illustrates an example of the shape of another spring-like conductive member according to the embodiment.

Next, referring to FIGS. 4 and 5, an example of the shape of the spring-like conductive member 50 is described. FIG. 4 illustrates a shape 1 of a spring-like conductive member 50 according to one embodiment. FIG. 5 illustrates a shape 2 of the spring-like conductive member 50 according to another embodiment.

(Shape 1)

Referring FIG. 4, in an example of the shape 1 of the spring-like conductive member 50, the first spring-like member 50a has a structure in which circular portions each having a predetermined width are disposed in the circumferential direction at a predetermined gap through the entire periphery. Referring to a cross-sectional view along a line A-A of FIG. 4, an opening portion 50a1 is provided at a part of the circular portion of the first spring-like member 50a.

In a manner similar thereto, the second spring-like member 50b has a structure in which circular portions each having a predetermined width are disposed in the circumferential direction at a predetermined gap through the entire periphery. Referring to a cross-sectional view along the line A-A of FIG. 4, an opening portion 50b1 is provided at a part of the circular portion of the second spring-like member 50b.

The circular portion of the first spring-like member 50a and the circular portion of the second spring-like member 50b have identical sizes and identical widths, and are vertically connected to the connecting portion 50c formed in a linear shape. The opening portions 50a1 of the first spring-like members 50a have identical sizes and open in identical directions. In a similar manner thereto, the opening portions 50b1 of the second spring-like members 50b have identical sizes and open in identical directions.

(Shape 2)

Referring FIG. 5, in an example of the shape 2 of the spring-like conductive member 50, the first spring-like member 50a has a structure in which circular portions each having a predetermined width are disposed in the circumferential direction at a predetermined gap through the entire periphery. Referring to cross-sectional views along a line B-B and a line C-C of FIG. 5, an opening portion 50a1 is provided at a part of the circular portion of the first spring-like member 50a. The circular portion of the first spring-like member 50a is in a shape of a circular arc greater than a semicircle, and can flexibly transform inside the first recess 30a due to the presence of the opening portion 50a1.

In a manner similar thereto, the second spring-like member 50b has a structure in which circular portions each having a predetermined width are disposed in the circumferential direction at a predetermined gap through the entire periphery. Referring to cross-sectional views along the line B-B and the line C-C of FIG. 5, an opening portion 50b1 is provided at a part of the circular portion of the second spring-like member 50b. The circular portion of the second spring-like member 50b is in a shape of a circular arc greater than a semicircle, and can flexibly transform inside the second recess 11a1 due to the presence of the opening portion 50b1.

The circular portion of the first spring-like member 50a and the circular portion of the second spring-like member 50b have identical sizes and identical widths, and are vertically connected to the connecting portion 50c formed in a linear shape. The opening portion 50a1 of the circular portion in the first spring-like member 50a and the opening portion 50b1 of the circular portion in the second spring-like member 50b, which are vertically connected, have identical sizes and open in mutually opposite directions.

Referring to FIG. 5, the opening portions 50a1 of the first spring-like members 50a disposed in the circumferential direction alternately open in identical directions, and adjacent opening portions 50a1 of the adjacent first spring-like members 50a disposed in the circumferential direction open in opposite directions. In a manner similar thereto, the opening portions 50b1 of the second spring-like members 50b disposed in the circumferential direction alternately open in identical directions, and adjacent opening portions 50b1 of the adjacent second spring-like members 50b disposed in the circumferential direction open in opposite directions. With this, the circular portions of the first spring-like members 50a and the corresponding circular portions of the second spring-like members 50b alternately open in opposite directions.

In the shapes 1 and 2 of the spring-like conductive member 50 of this embodiment, the opening portion 50a1 of the circular portion of the first spring-like member 50a transforms and contacts the first recess 30a of the edge ring 30 at a side surface of the circular portion of the first spring-like member 50a.

Inside the second recess 11a1 formed on the base stage 11a of the mounting stage 11, the opening portion 50b1 of the circular portion of the second spring-like member 50b transforms and contacts the second recess 11a1 of the base stage 11a at a side surface of the circular portion of the second spring-like member 50b. With this, the edge ring 30 and the base stage 11a can stably contact.

Especially, in the shape 2 of the spring-like conductive member 50, the directions of mutually adjacent opening portions 50a1 of the corresponding first spring-like members 50a and the directions of mutually adjacent opening portions 50b1 of the corresponding second spring-like members 50b are respectively different. Therefore, the circular portions of the first spring-like members 50a and the circular portions of the second spring-like members 50b tend to easily transform and easily return to the original state.

For example, the circular portions of the first spring-like members 50a and the circular portions of the second spring-like members 50b are respectively engaged in the first recesses 30a and the second recesses 11a1, the opening portions 50a1 and the opening portions 50b1 transform. Further, after the first spring-like members 50a and the second spring-like members 50b are embedded, the opening portions 50a1 and the opening portions 50b1 return back to the original state. With this, side surfaces of the circular portions of the first spring-like members 50a and the second spring-like members 50b certainly contact the first recesses on the edge ring 30 and the second recesses 11a1 on the base stage 11a. With this, the edge ring 30 and the mounting stage 11 can have the same potential so that the thickness of the sheath of the edge ring 30 can be accurately controlled.

Further, the spring-like conductive member 50 having thus structured shape 2 has a high degree of freedom in the transformation so as to enable repeated uses after replacing the edge ring 30 is replaced. Therefore, the cost can be reduced due to the reuse.

Referring to FIG. 4, the spring-like conductive member 50 of the shape 1 is formed of a sheet of plate P, in which multiple circular portions of the first spring-like members 50a and multiple circular portions of the second spring-like members 50b are connected by the connecting portions.

Referring to FIG. 5, in the spring-like conductive member 50 of the shape 2, the circular portions of the first spring-like members 50a of a plate P1 and the circular portions of the first spring-like members 50a of another plate P2 are alternately arranged at predetermined intervals. In a manner similar thereto, the circular portions of the second spring-like members 50b of the plate P1 and the circular portions of the second spring-like members 50b of another plate P2 are alternately arranged at predetermined intervals.

The two plates P1 and P2 illustrated in FIG. 5 are joined by, for example, welding at the connecting portion 50c so as to be integrated. However, it is possible to form the spring-like conductive member 50 of the shape 2 using a single sheet of plate without providing the joining portion. Below the position where the circular portion of the first spring-like member 50a of one of the plates P1 and P2 is disposed, the circular portion of the second spring-like member of the other one of the plates P1 and P2.

[Results of Heat Generation Evaluation with Respect to the Positions of the Spring-Like Conductive Member]

Figure 6:
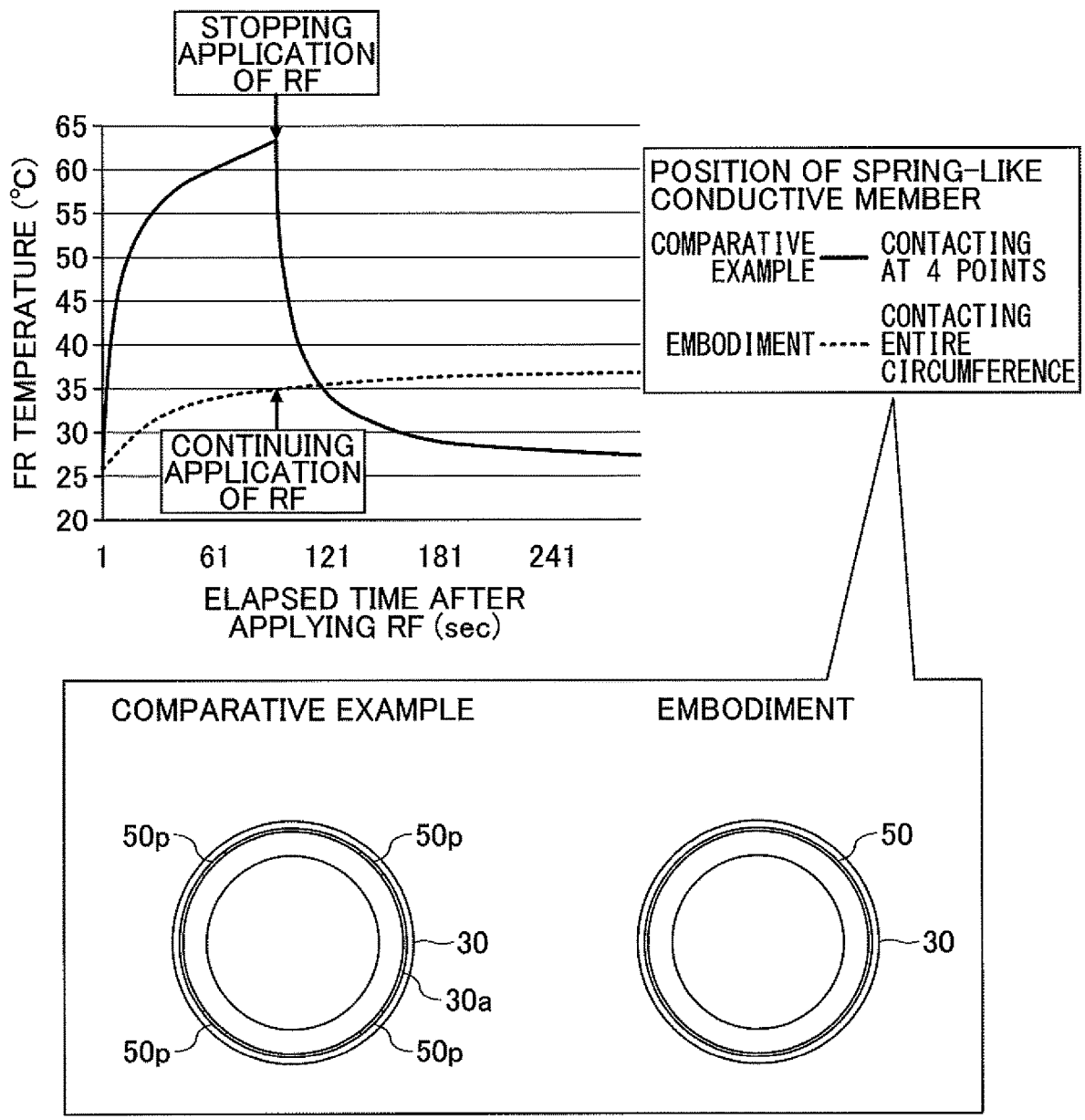
FIG. 6 illustrates an example of the result of an heat generation evaluation of the spring-like conductive member according to the embodiment.

Referring to FIG. 6, described is an example of a test result of a heat generation evaluation with respect to the position of the spring-like conductive member 50. FIG. 6 illustrates the results of the tests of heating conditions of the edge ring 30 according to the position of the spring-like conductive member 50 in this embodiment and the positions in a comparative example. As illustrated in the positions of the spring-like conductive member, within this embodiment, the spring-like conductive member 50 are provided inside the first recess 30a formed on the lower surface of the edge ring 30 through the entire circumference 50. Meanwhile, in the comparative example, a spring-like conductive member 50p having a size of 10 mm are provided inside the first recess 30a formed on the lower surface of the edge ring 30 at four positions being apart evenly at four positions.

Examples of results of this heat generation evaluation in this embodiment and the comparative example are depicted in the graph of FIG. 6. This test is conducted using the processing apparatus 1 of this embodiment under conditions that high-frequency power having a frequency of 3.2 MHz and 1 kW is applied from the second high frequency power source 22 to the mounting stage 11 (hereinafter, referred to as "RF application"). The horizontal axis of the graph indicates an elapsed time after the RF application (RF application time), and the vertical axis indicates the maximum temperature of the edge ring (FR) 30.

With this, according to the positions of the spring-like conductive member 50 according to the embodiment, the spring-like conductive member contacts the edge ring 30 through the entire circumference. Therefore, a contact area between the spring-like conductive member 50 and the edge ring 30 is wide, a temperature increase of the edge ring 30 after applying RF is moderate, and it is known that the temperature increase is low even after the RF application time of 200 seconds elapses.

Meanwhile, the spring-like conductive member 50p of the comparative example contacts the edge ring 30 at four points. Therefore, it is known that a contact area between the edge ring 30 and the spring-like conductive member 50p is small so that the temperature increase is rapid after the RF application. In the comparative example, at around the RF application time of 100 seconds, the RF application is stopped to prevent damage of the edge ring 30. Therefore, in the comparative example, the temperature of the edge ring 30 rapidly decreases in mid-course.

As a result, in positioning the spring-like conductive member 50 according to this embodiment, the in-plane temperature difference of the lower surface of the edge ring 30 while applying RF is 5.4° C. Meanwhile, in positioning the spring-like conductive member 50p according to Comparative Example, the in-plane temperature difference of the lower surface of the edge ring 30 while applying RF is 36.9° C.

Within the test result, when the spring-like conductive member 50 according to this Embodiment is positioned through the entire circumference on the lower surface of the edge ring 30, the temperature increase of the edge ring 30 becomes moderate and a risk of damage in the edge ring 30 is lowered. However, the spring-like conductive member 50 is not always positioned through the entire circumference as long as the spring-like conductive member 50 is positioned so as to contact the lower surface of the edge ring 30 in an area that does not cause a rapid temperature increase.

As described, according to the spring-like conductive member 50 of the embodiment and the processing apparatus 1 including and using this spring-like conductive member, the first spring-like member 50a and the second spring-like member 50b can be flexibly transformed inside the first and second recesses 30a and 11a1 formed on the edge ring 30 and the base stage 11a of the mounting stage 11, respectively. With this, the edge ring 30 and the base stage 11a can stably contact each other. With this, the edge ring 30 and the base stage 11a can have the same potential so that the thickness of the sheath of the edge ring 30 can be accurately controlled.

As a result, within this embodiment, the direct voltage output from the variable direct current power source can be certainly applied to through the base stage 11a to the edge ring 30. With this, the sheath of the edge ring 30 can be accurately controlled while processing the plasma so that the uniformity of the in-plane distribution is enhanced and simultaneously tilting is suppressed. As a result, it is possible to make a time of replacing the edge ring 30 delay and improve the productivity.

Further, the spring-like conductive member 50 of this embodiment is positioned through the entire circumference. With this, the first spring-like member 50a and the second spring-like member 50b can be made uniformly touch each other so as to moderate the increase of the temperature in the edge ring.

Further, the spring-like conductive member 50 of this embodiment is provided between the first recess 30a on the lower surface of the edge ring 30 and the second recess 11a1 of the upper surface of the base stage 11a to form the contact structure that is hardly exposed to plasma. With this, it is possible to prevent the abnormal electrical discharge from generating. With this, it is possible to make it unnecessary to provide a labyrinth structure in the edge ring 30 and the mounting stage 11.

The mounting apparatus for the object to be processed and the processing apparatus are described in the above embodiment. For example, the mounting apparatus for the object to be processed includes a mounting stage 11 on which the object to be processed is mounted, the edge ring 30 disposed at peripheral edge portion of the mounting stage 11, and the spring-like conductive member including the first spring-like member 50a contacting the edge ring 30 at the first recess formed on the edge ring 30, and the second spring-like member 50b contacting the mounting stage 11 at the second recess formed on the edge ring 30.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the mounting apparatus has been described in detail, it should be understood that various changes, substitutions, and alterations could be made thereto without departing from the spirit and scope of the invention.

For example, the present invention is applicable not only to a two-frequencies application apparatus of a parallel flat plate type illustrated in FIG. 1 but also to another plasma processing apparatus and another non-plasma processing apparatus. The other plasma processing apparatus is a Capacitively Coupled Plasma (CCP) apparatus, an Inductively Coupled Plasma (ICP) processing apparatus, a processing apparatus using a radial line slot antenna, a Helicon Wave Plasma (HWP) apparatus, an Electron Cyclotron Resonance Plasma (ECR) apparatus, a surface wave processing apparatus, and so on. The other non-plasma processing apparatus is a processing apparatus that processes the wafer by heat treatment and so on.

Although the specification has been described about the semiconductor wafer as an object to be processed, the present invention is inclusively applicable to various substrates used for Liquid Crystal Display (LCD), Flat Panel Display (FPD) or the like, a photo mask, a CD substrate, a printed wiring board, or the like.

What is claimed is:

1. A mounting apparatus for an object to be processed, the mounting apparatus comprising:
a mounting stage, on which the object to be processed is mounted inside a plasma processing container;
an edge ring disposed in a peripheral edge portion of the mounting stage, and
a spring-like conductive member that includes
a plurality of first spring-like members that are inserted into a first recess formed in a circumferential direction through an entire periphery on a lower surface of the edge ring,
a plurality of second spring-like members that are inserted inside in a second recess formed in the mounting stage, the first recess and the second recess being formed so as to face each other, and
a connecting portion that connects the first spring-like members to the second spring-like members,
wherein the connecting portion is a strip in a form of a ring disposed between the first and second recesses,
wherein each of the first spring-like members and the second spring-like members is shaped like a partly opened circle, and has a predetermined width,
wherein the plurality of first spring-like members are arranged to contact the edge ring through the entire periphery at a predetermined interval, and the plurality of second spring-like members are arranged to contact the mounting stage through the entire periphery at another predetermined interval, and
wherein partly opened ends of the plurality of first spring-like members and partly opened ends of the plurality of second spring-like members are formed to face in the same direction or opposite direction.

2. The mounting apparatus according to claim 1,
wherein a cross-sectional view of the first recess along a radial direction is in a tapered shape such that an opening portion of the first recess is narrower than a bottom portion of the first recess, and
wherein a cross-sectional view of the second recess along the radial direction is in a tapered shape such that an opening portion of the first recess is narrower than a bottom portion of the second recess.

3. The mounting apparatus according to claim 1,
wherein the connecting portion vertically connects the plurality of first spring-like members to the plurality of second spring-like members.

4. The mounting apparatus according to claim 1,
wherein the plurality of the first spring-like members and the plurality of the second spring-like members are vertically connected.

5. The mounting apparatus according to claim 4,
wherein a partly opened end of one of the plurality of the first spring-like members and a partly opened end of one of the plurality of the second spring-like members, which is positioned adjacent to one of the plurality of the first spring-like members, are formed to face the opposite direction.

6. The mounting apparatus according to claim 1,
wherein the first recess is formed on a lower surface of the edge ring,
the second recess is formed at a position corresponding to the first recess on an upper surface of the mounting stage, and
the plurality of first spring-like members fit in the first recess, and the plurality of second spring-like members fit in the second recess.

7. A processing apparatus comprising:
a plasma processing container;
a mounting stage, on which an object to be processed is mounted inside the plasma processing container;
an edge ring disposed in a peripheral edge portion of the mounting stage;
a variable direct current power source that applies direct voltage from the mounting stage to the edge ring; and
a spring-like conductive member that includes
a plurality of first spring-like members that are inserted into a first recess formed in a circumferential direction through an entire periphery on a lower surface of the edge ring,
a plurality of second spring-like members that are inserted inside in a second recess formed in the mounting stage,
the first recess and the second recess being formed so as to face each other, and
a connecting portion that connects the first spring-like members to the second spring-like members,
wherein the connecting portion is a strip in a form of a ring disposed between the first and second recess,
wherein each of the first spring-like members and the second spring-like members is shaped like a partly opened circle, and has a predetermined width,
wherein the plurality of first spring-like members are arranged to contact the edge ring through the entire periphery at a predetermined interval, and the plurality of of the second spring-like members are arranged to contact the mounting stage through the entire periphery at another predetermined interval, and
wherein partly opened ends of the plurality of first spring-like members and partly opened ends of the plurality of second spring-like members are formed to face in the same direction or opposite direction.

* * * * *